United States Patent
Fischer et al.

(10) Patent No.: US 6,643,198 B2
(45) Date of Patent: Nov. 4, 2003

(54) RAM CIRCUIT WITH REDUNDANT WORD LINES

(75) Inventors: Helmut Fischer, Oberhaching (DE); Ellen Zimmermann, Aying (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/185,280

(22) Filed: Jun. 27, 2002

(65) Prior Publication Data

US 2003/0002361 A1 Jan. 2, 2003

(30) Foreign Application Priority Data

Jun. 27, 2001 (DE) .......................................... 101 30 978

(51) Int. Cl.$^7$ ................................................. G11C 7/00
(52) U.S. Cl. .................. 365/200; 365/230.06; 365/210; 365/189.08
(58) Field of Search .................. 365/200, 210, 365/230.06, 189.08

(56) References Cited

U.S. PATENT DOCUMENTS

| | | | |
|---|---|---|---|
| 5,461,589 A | | 10/1995 | Hidaka et al. |
| 5,544,113 A | * | 8/1996 | Kirihata et al. ............. 365/200 |
| 5,920,515 A | * | 7/1999 | Shaik et al. ................. 365/200 |
| 6,134,175 A | * | 10/2000 | Forbes et al. .......... 365/230.06 |

FOREIGN PATENT DOCUMENTS

DE        199 33 894 A1        1/2000

* cited by examiner

Primary Examiner—David Nelms
Assistant Examiner—Long Tran
(74) Attorney, Agent, or Firm—Laurence A. Greenberg; Werner H. Stemer; Gregory L. Mayback

(57) ABSTRACT

A RAM circuit has a memory cell array whose number of rows is an integer multiple of an integer p>1 and is composed of regular and redundant rows. Each row is assigned a driver. The space occupied by the cell array and by the drivers is subdivided into two sections, in each of which there is situated a subset of the regular rows and a subset of the redundant rows. In the first section, the number of rows is by a number k smaller than an integer multiple of p. In each section, each driver occupies a location allocated to it in a regular two-dimensional pattern of locations, each of which has one of p possible X coordinates in the row direction. The locations of the pattern are occupied without any vacancies within the first section, and, within the second section, p–k locations of the pattern are unoccupied.

7 Claims, 8 Drawing Sheets

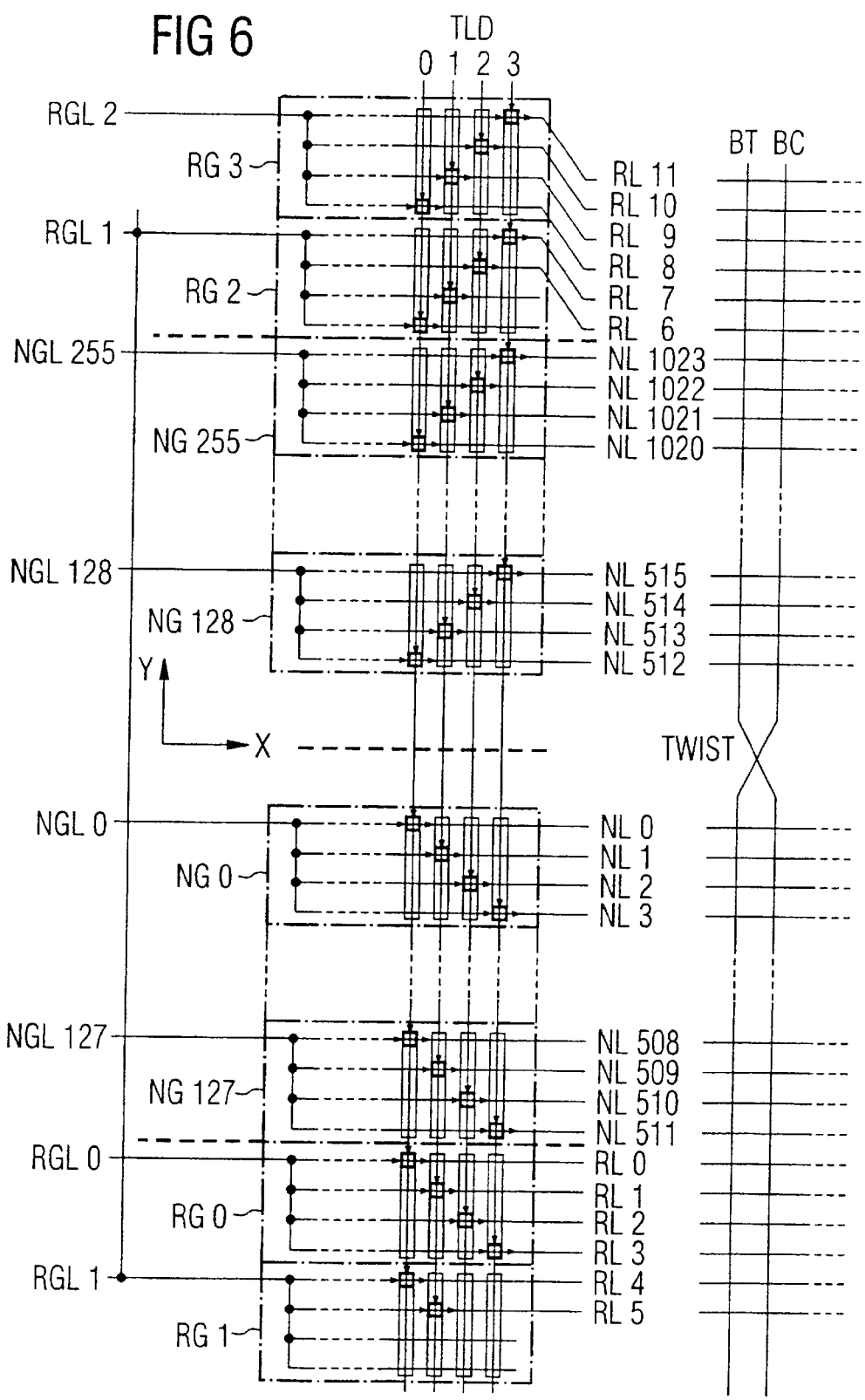

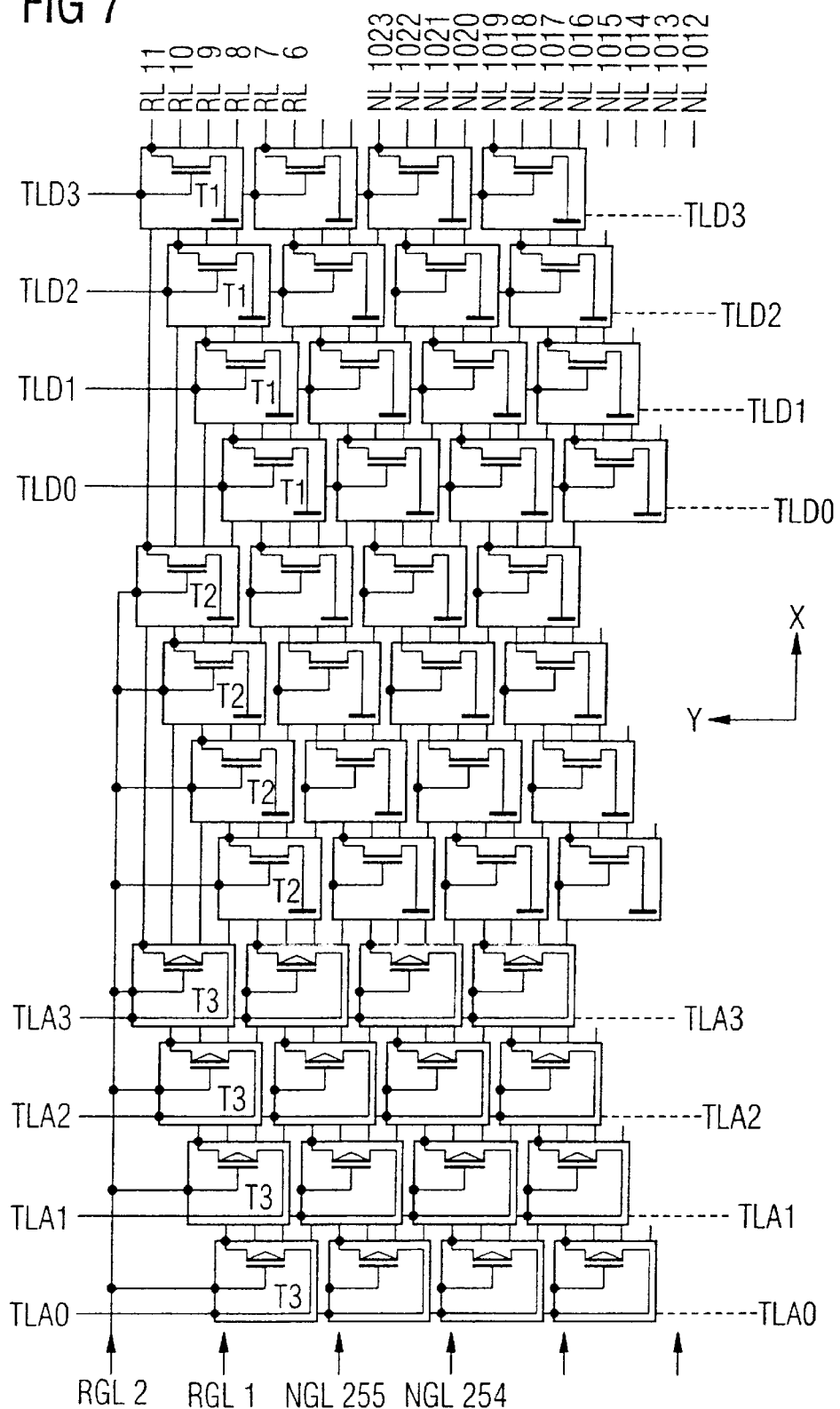

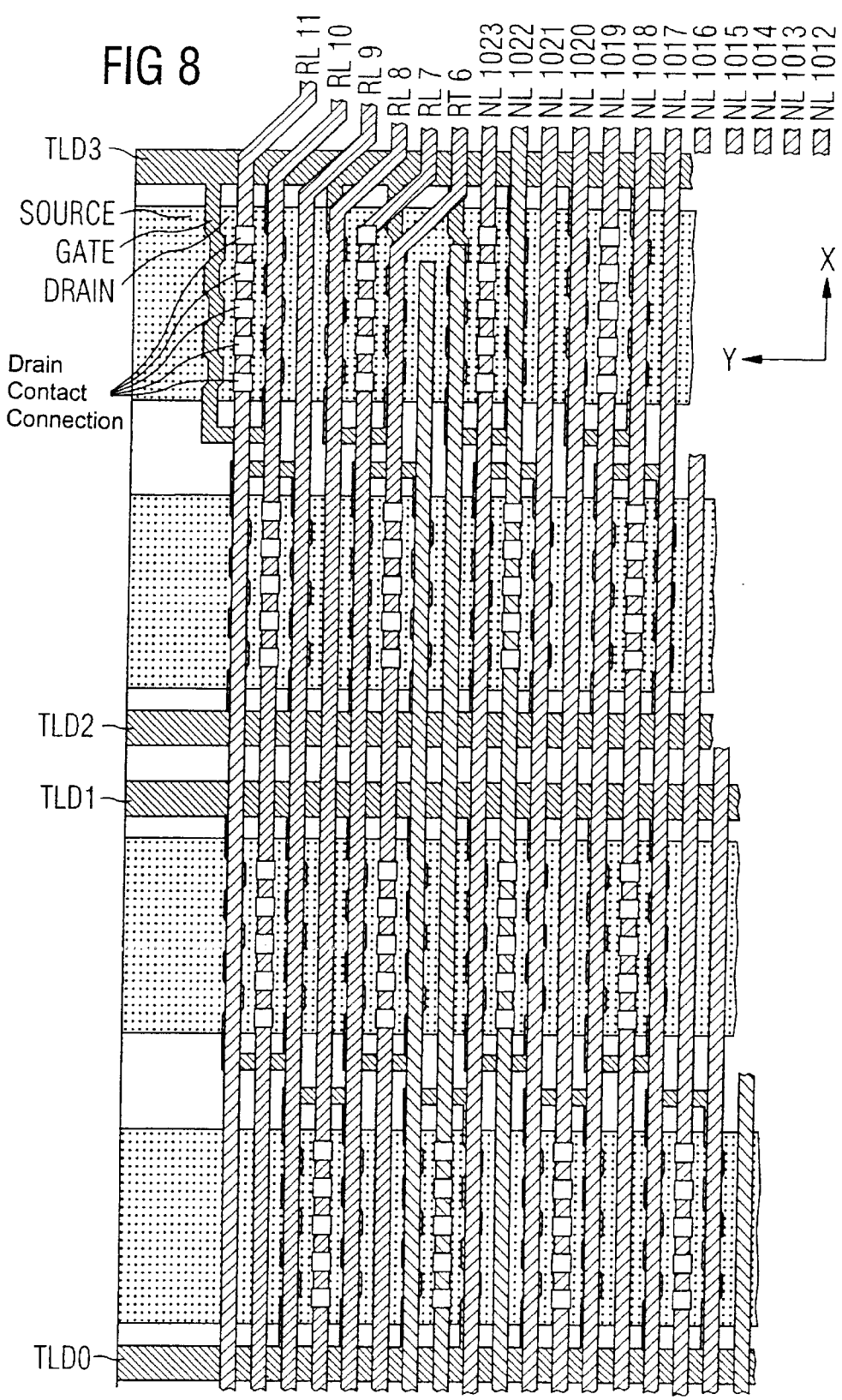

RAM CIRCUIT WITH REDUNDANT WORD LINES

BACKGROUND OF THE INVENTION

Field of the Invention

The invention relates to a RAM (Random Access Memory) circuit having a memory cell array in the form of a matrix-type configuration of rows and columns. The total number of the rows includes a number of regular rows and a number of redundant rows and each row is assigned a word line for activating and deactivating the memory cells of the relevant row.

In RAMs of the aforementioned type, each word line is connected to a dedicated driver containing a plurality of switching elements, usually field-effect transistors (FETs), which respond to control signals in order to put the relevant word line either at an activation potential or at a deactivation potential. Only in the activated state of a word line are the memory cells of the associated row conditioned for a write or read access, the access itself being effected via bit lines assigned to the individual columns of the cell array.

In the layout of an integrated circuit, the aforementioned word line drivers are arranged in a driver array along one of the column-parallel edges of the cell array where the input-side ends of the word lines are situated. In large scale integrated memory chips, the pitch of the word lines (e.g. 0.17 μm center-to-center distance) is significantly smaller than the width—running in the column direction—of each individual transistor of the drivers. Consequently, each driver extends of necessity over the width of a plurality of word lines in the column direction. This makes it necessary to arrange in each case a plurality of drivers offset (that is to say spatially "one behind the other") in the row direction, the number p of the drivers in each of these groups being at least as large as the number of word lines which find space within the required width of a driver. Each driver group is thus assigned to a group of p adjacent word lines.

For reasons of memory organization and with the aim of economic utilization of the chip area, it is advisable and customary to choose the number p of drivers or word lines per group (that is to say the "group strength") such that the total number n of regular rows or word lines is divisible by p without remainder and, consequently, an integer number g=n/p of groups is fully occupied. In this case, each word line is uniquely selectable through the use of an input address which is applied to the memory chip and is hierarchically composed of exactly one of g possible group addresses which identifies the relevant word line group, and exactly one of p possible position addresses which identifies the position of the word line within the respective group. Accordingly, a word line decoder is constructed hierarchically in two stages: a 1-out-of-g group decoder which responds to the group address addresses the respective driver group, and each of the g driver groups is configured, for its part, as a 1-out-of-p decoder which responds to the position address in order to drive the addressed word line within the relevant group.

For layout reasons the drivers must be spatially arranged such that they occupy locations in a regular pattern. Each location is determined by an X coordinate measured in the row direction and a Y coordinate measured in the column direction. Given a number of rows n+r and a group strength p, there are p possible X coordinates and (n+r)/p possible Y coordinates, if n+r is an integer multiple of p, with n being the number of regular rows and r being the number of redundant rows.

The redundant rows and word lines serve for repairing the cell array, i.e. for replacing defective rows, if the test run of the memory has demonstrated such defects. This replacement is done, in principle, by reprogramming the addresses of the word lines of defective rows through the use of generally known fuse technology within the decoding device into addresses of redundant word lines, so that the input addresses themselves can be maintained unaltered.

The reprogramming of the addresses is simpler, the fewer bits of an input address have to be reprogrammed. The fuse technology used for this purpose becomes the least complicated if, in the case of a defective row, all p rows of the relevant group of rows are replaced by a whole group of p redundant rows, because then only bits of the group address need to be changed. For this reason, the number r of redundant word lines is usually likewise an integer multiple of the group strength p, so that the same hierarchical address structure (group addresses with in each case p position addresses) as for the regular word lines holds true. Although a groupwise repair entails the risk of a certain degree of waste, this can be kept within limits if it is taken into consideration that defects often occur in clusters anyway, that is to say simultaneously encompass a plurality of adjacent word lines. Nevertheless, the practice of groupwise repair requires that, for a given number of regular rows, more redundant rows have to be provided than in cases where it is possible to repair individual rows or bundles of rows which are smaller than the group strength p.

Important criteria for the number of redundant rows to be chosen are the associated increase in area and the exploitation or defect probability of the regular rows. An excessively small number of redundancies leads to memories that cannot be completely repaired, while too many redundant rows increase the chip area unnecessarily. In the case of large memories (e.g. above 256 MB), it is allowable, under certain circumstances, to replace an entire group of e.g. p=4 regular rows by an equally sized group of redundant rows (so-called quadruple redundancy) even if only one row in the group is defective. In the case of smaller memories, however, it is advisable to subdivide the repair possibilities more finely. Thus, in the case of a 128 MB-DRAM, for example, it is recommendable to provide, for 1024 regular rows in each case, 12 redundant rows and the possibility of pairwise repair, so that the repair supply includes 6 pairs.

In earlier times, the redundant rows were positioned in a common contiguous block at an outer edge of the cell array. Advantages may be afforded, however, by departing from this practice and arranging the quantity of redundant rows as two separate subsets in two different sections of the cell array.

One of these advantages is ensuring a "topologically correct" repair if a so-called bit line twist is present in the cell array. This is understood as the known measure of transposing selected bit line cores at a location within the cell array, the so-called "twist region", in order to reduce the risk of undesirable signal coupling. The twist has the effect that the sections of the cell array have a different data topology on both sides of the twist region, i.e. the pattern of the assignment between the polarity of the memory cell charge and the data evaluation on the bit lines is different on one side of the twist region than on the other side. Only if redundant rows are present on each side can a defective row always be replaced by a redundant row of the same data topology.

Furthermore, it may be expedient, even with no twist present, to position redundant rows at both edges of the cell array. This reduces the defect probability for regular rows, because the defect risk is greater at the edges than in the interior of the cell array.

Dividing the redundant rows between two sections of the cell array poses no problems if the number of such rows in each of the two sections is an integer multiple of the group strength p. However, this requires the total number r of redundant rows to be an integer multiple of p. This means, however, e.g. given the group strength p=4, that the possible total number of redundant word lines is limited to 16 or 24 or 32, etc. A problem arises if one wishes to choose a different number (e.g. 12) for the reasons presented further above. This is because the situation then arises wherein the number of rows is not an integer multiple of p in each of the two sections, unless the total number of all the regular rows is also made not equal to a multiple of p. This last is undesirable, however.

If, in the first of the two sections, the number of rows is a number k less than an integer multiple of p (and, correspondingly, the number of rows in the second section is k greater or p−k less than an integer multiple of p), a continuously regular layout of the word line drivers within the driver array is no longer possible. This is due to the fact that the X coordinates of the k drivers which lack the integer multiple of p in the first section do not correspond to the X coordinates of the p−k drivers which lack an integer multiple of p in the second section.

Since the resultant layout problem has not been satisfactorily solved hitherto, all that has remained in practice has been the possibility either of making the number of redundant word lines equal to an even-numbered multiple of the group strength, or of combining all the redundant word lines in one of the two sections. However, as stated, the former prohibits an optimal choice of the number of redundant rows and thus limits the possibility for reducing the area requirement of the cell array, and the latter means dispensing with the abovementioned advantage of a reduced defect risk for regular word lines and, in the case of a bit line twist that is present, dispensing with the possibility of an always topologically correct repair.

SUMMARY OF THE INVENTION

It is accordingly an object of the invention to provide a RAM circuit which overcomes the above-mentioned disadvantages of the heretofore-known RAM circuits of this general type and which has redundant rows and which has both the advantages which result from a number of redundant rows that deviates from an even-numbered multiple of the group strength, and the advantages which result from positioning the redundant rows in two separate sections.

With the foregoing and other objects in view there is provided, in accordance with the invention, a RAM circuit, including:

a memory cell array including memory cells, rows and columns;

the rows and columns defining a row direction and a column direction and forming a matrix configuration, a total number of the rows being an integer multiple of an integer number p>1, the rows including an integer number n of regular rows and an integer number r of redundant rows; regular word lines and redundant word lines;

each of the rows being assigned a respective one of the regular and redundant word lines for activating and deactivating the memory cells in a relevant one of the rows;

the memory cell array having column-parallel side edges;

a driver array disposed parallel to one of the column-parallel side edges of the memory cell array, the driver array including a plurality of drivers, a respective one of the drivers being contact-connected to a respective one of the regular and redundant word lines for driving the respective one of the regular and redundant word lines;

the memory cell array and the driver array occupying a given space subdivided into a first section and a second section;

an integer number n1>0 of the regular rows and an integer number r1>0 of the redundant rows being disposed in the first section, and n1+r1 of the drivers being disposed in the first section;

an integer number n2>0 of the regular rows and an integer number r2>0 of the redundant rows being disposed in the second section, where n1+r1 is by an integer number k less than an integer multiple of the integer number p, and n2+r2 of the drivers being disposed in the second section;

the n1+r1 of the drivers disposed in the first section each occupying a respective location allocated thereto in a regular two-dimensional first pattern of locations, the locations in the first pattern having Y coordinates measured in the column direction, the Y coordinates of the locations in the first pattern being uniformly spaced apart, each of the locations in the first pattern having one of p possible X coordinates in the row direction, adjacent ones of the locations in the first pattern with a same one of the X coordinates being spaced apart by a distance in the column direction equal to p times a spacing distance of the Y coordinates of the locations in the first pattern;

the n2+r2 of the drivers disposed in the second section each occupying a respective location allocated thereto in a regular two-dimensional second pattern of locations, the locations in the second pattern having Y coordinates measured in the column direction, the Y coordinates of the locations in the second pattern being uniformly spaced apart, each of the locations in the second pattern having one of the p possible X coordinates in the row direction, adjacent ones of the locations in the second pattern with a same one of the X coordinates being spaced apart by a distance in the column direction equal to p times a spacing distance of the Y coordinates of the locations in the second pattern;

the first section having an outer edge with p−k last ones of the locations in the first pattern disposed in the outer edge; and the locations in the first pattern being occupied without any vacancies within the first section and, within the second section, p−k of the locations in the second pattern being unoccupied locations with X coordinates identical to the X coordinates of the p−k last ones of the locations in the first pattern.

In other words, the invention is realized in a RAM circuit containing a memory cell array and a driver array. The memory cell array forms a matrix-type configuration of rows and columns, the total number of rows being an integer multiple of an integer p>1 and being composed of a number n of regular rows and a number r of redundant rows, each row being assigned a regular or redundant word line for the activation and deactivation of the memory cells of the relevant row. The driver array is arranged parallel to one of the column-parallel side edges of the cell array and contains, for each word line, a driver that is contact-connected to precisely this word line, for driving the latter.

According to the invention, the space occupied by the cell array and by the driver array is subdivided into two sections, in the first section of which there is situated a number n1>0 of regular rows and a number r1>0 of redundant rows and in the second section of which there is situated a number n2>0 of regular rows and a number r2>0 of redundant rows, where n1+r1 is by a number k smaller than an integer multiple of p. Each of the n1+r1 drivers of the first section occupies a location allocated to it in a regular two-dimensional first pattern of locations whose Y coordinates measured in the column direction are uniformly spaced apart and each of which has one of p possible X coordinates in the row direction, adjacent locations with the same X coordinate having a distance in the column direction which is equal to p times the distance of the Y coordinates. Each of the n2+r2 drivers of the second section occupies a location allocated to it in a regular two-dimensional second pattern of locations whose Y coordinates measured in the column direction are uniformly spaced apart and each of which has one of the p possible X coordinates in the row direction, adjacent locations with the same X coordinate having a distance in the column direction which is equal to p times the distance of the Y coordinates. The locations of the first pattern are occupied without any gaps or vacancies within the first section and, within the second section, p−k locations of the second pattern are unoccupied, to be precise those whose X coordinates are identical to the X coordinates of the p−k last locations of the pattern which are occupied at the outer edge of the first section.

The features of the invention presented above ensure that none of the drivers has to occupy a location which does not fit the layout pattern of the drivers. The layout problem indicated above is thus solved. This problem and the way in which this problem is solved according to the invention are explained in more detail below with reference to drawings. The invention is preferably, but not exclusively, used for dynamic RAMs (DRAMs).

According to another feature of the invention, the memory cell array includes a bit line twist region; and the first and second sections lie on respective different sides of the bit line twist region.

According to another feature of the invention, the first and second sections each have a respective outer edge such that at least a subset of the redundant rows are disposed in the outer edge.

According to yet another feature of the invention, in each of the first and second sections, the redundant rows form a contiguous block.

According to a further feature of the invention, in each of the first and second sections, all of the redundant rows situated in a respective one of the first and second sections form a contiguous block at an outer edge of the respective one of the first and second sections; and within the second section, the p−k unoccupied locations in the second pattern lie between locations occupied by the drivers for the regular rows and locations occupied by the drivers for the redundant rows.

According to another feature of the invention, the integer number n1 is equal to the integer number n2, the integer number r1 is equal to the integer number r2; and the integer number n1, the integer number r2 and the integer number r are integer multiples of the integer number p.

According to another feature of the invention, the integer number p is an integer power of 2.

Other features which are considered as characteristic for the invention are set forth in the appended claims.

Although the invention is illustrated and described herein as embodied in a RAM with redundant word lines, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 6 is a schematic view of a layout for illustrating the solution according to the invention to the problem illustrated in FIG. 5 using an illustration similar to FIGS. 1 and 5;

FIG. 7 is a schematic diagram for explaining the solution according to the invention in an illustration similar to FIG. 3; and FIG. 8 is a diagrammatic partial view of an example of the exact layout in the case of the solution according to the invention in an illustration similar to FIG. 4.

DESCRIPTION OF THE PREFERRED EMBODIMENTS

Figure 1:
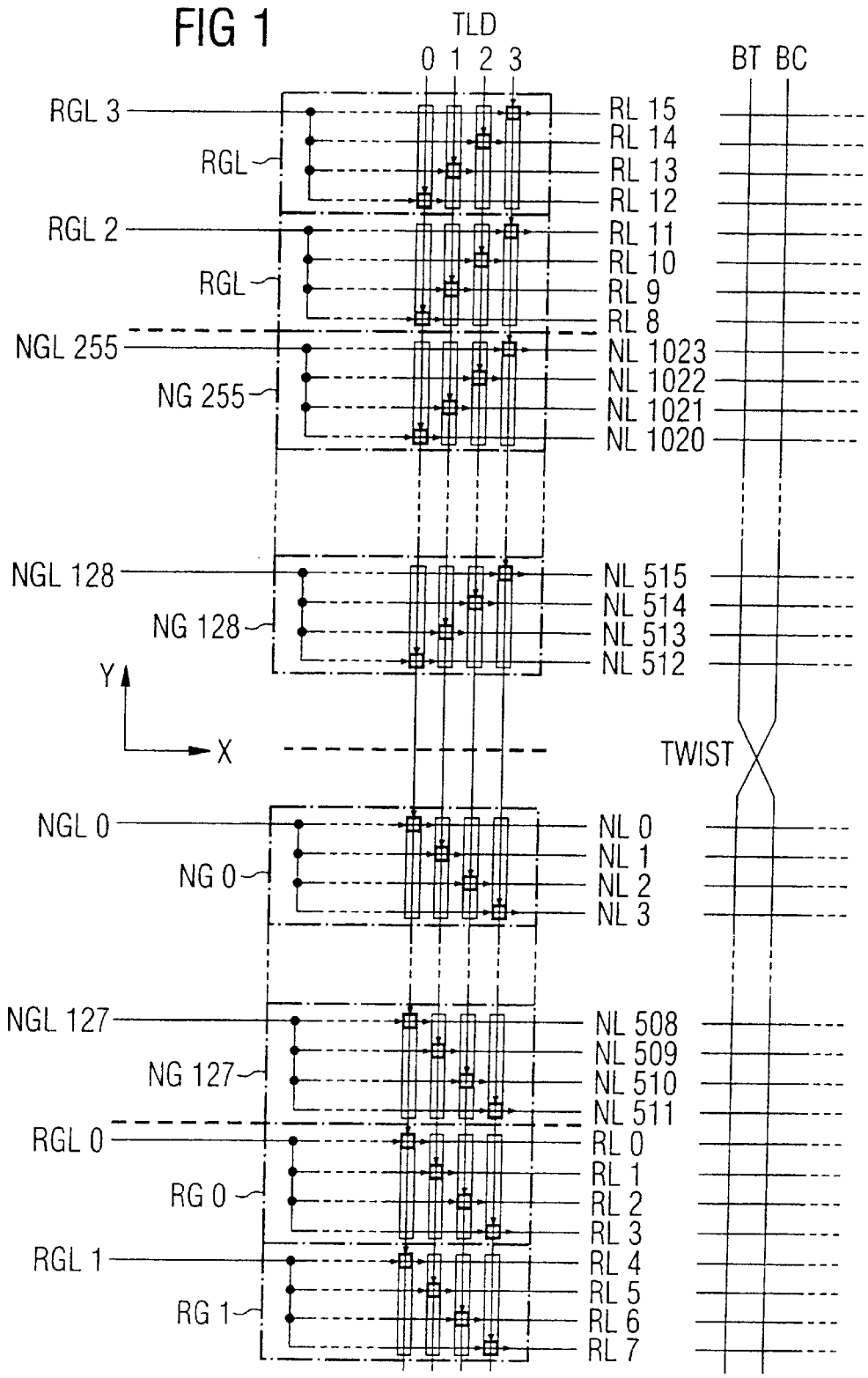
FIG. 1 is a schematic view of an example of the layout and connection configuration of driver groups according to the invention for selectively driving the word lines of a memory cell array formed of n=g·p regular rows and r=h·p redundant rows, the redundant word lines being divided between two equally sized blocks in opposite edge regions of the cell array and h being an even number.

In the description below and in the drawings, identical abbreviations in upper case letters are in each case used for identical elements (e.g. NL for regular or "normal" word line), with index number positioned afterward, e.g. NL1023 for the regular word line No. 1023. In order to designate a plurality of identical elements, the relevant numbers are positioned afterward in brackets { }, e.g. NL{0,3} for "NL0 and NL3", or NL{0:3} for "NL0 to NL3".

Referring now to the figures of the drawings in detail and first, particularly, to FIG. 1 thereof, there is shown, in the right-hand part of FIG. 1, the word lines of a memory cell array of a DRAM are illustrated diagrammatically as horizontal lines. The cell array contains a large multiplicity of memory cells which form a matrix of rows and columns. Hereinafter, the spatial direction of the rows is designated by "X" and the spatial direction of the columns by "Y", as indicated by the arrows in all the figures. Each row is assigned in each case exactly one dedicated word line running in the X direction, which word line can be selectively activated and deactivated through the use of a respectively associated driver. Each column is assigned a two-core bit line (bit line pair with true core BT and complement core BC) which runs in the Y direction and can be driven via a respectively associated sense amplifier in order to write or read data to or from the memory cells of that row which has been selected by the activation of the relevant word line. The sense amplifiers (not illustrated) are arranged outside the cell array along the row-parallel edges of the cell array.

In the case shown, the cores of some bit line pairs, only one of which is illustrated in FIG. 1, interchange their position in a central region of the cell array, in order to reduce undesirable coupling between adjacent bit lines, as known per se. As mentioned further above, this so-called bit line twist has the effect that the data topology of the cell array is different on one side of the twist region than on the other side.

The cell array shown in FIG. 1 has $n=2^{10}=1024$ regular rows and thus 1024, "regular word lines" NL{0:1023} and, in addition, r=16 redundant rows and thus 16 "redundant word lines" RL{0:15}. In the case illustrated, the redundant word lines form two separate blocks of in each case r/2=8 word lines at the opposite outer edges of the cell array. This is advantageous for two reasons: firstly, a lower defect probability results for regular cells, because the defect risk is greatest at the outer edges, and secondly division into two blocks in the case of a bit line twist has the effect that redundant word lines with different topologies are available and, consequently, any arbitrary regular word line can be replaced by a redundant word line with in each case the "correct" topology.

In the case illustrated, the counting sequence of the word lines is mirror-inverted with respect to the central twist region. The counting sequence of the regular word lines NL with NL0 begins at the lower edge of the central twist region and runs via a total of n1=512 word lines down to NL511, followed by r1=8 redundant word lines RL{0:7}, where RL7 is that word line which lies nearest to the lower edge of the cell array. The counting sequence of the remaining n−n1 regular word lines NL{512:1023} begins at the upper edge of the twist region, and the last NL1023 is followed by the remaining r−r1 redundant word lines RL{8:15}, where RL15 is that word line which lies nearest to the upper edge of the cell array. In the case illustrated, n1=n2=n/2 and r1=r2=r/2.

Each word line is connected to a dedicated word line driver. In the case illustrated, the area extent of each driver transversely with respect to the row direction is almost p=4 times as large as the pitch of the word lines, so that in each case p=4 drivers have to be arranged as a group spatially one behind the other in the row direction. Each driver group is depicted with a broken-lined border in FIG. 1 (as likewise in FIGS. 5 and 6). There are thus a total of g=n/p=1024/4=256 driver groups NG{0:255} for the regular word lines NL and a total of h=r/p=16/4=4 driver groups RG{0:3} for the redundant word lines RL. The counting sequence of the regular and redundant driver groups is mirror-symmetrical with respect to the twist region in a similar manner to the counting sequence of the regular and redundant word lines. In other words, the driver groups NG{0:127}, RG{0:1} succeed one another downwards from the twist region, and the driver groups NG{128:255}, RG{2:3} succeed one another upwards from the twist region. In each driver group, all four drivers are jointly connected to a group selection line NGL or RGL, respectively, assigned to precisely this group.

Figure 2:
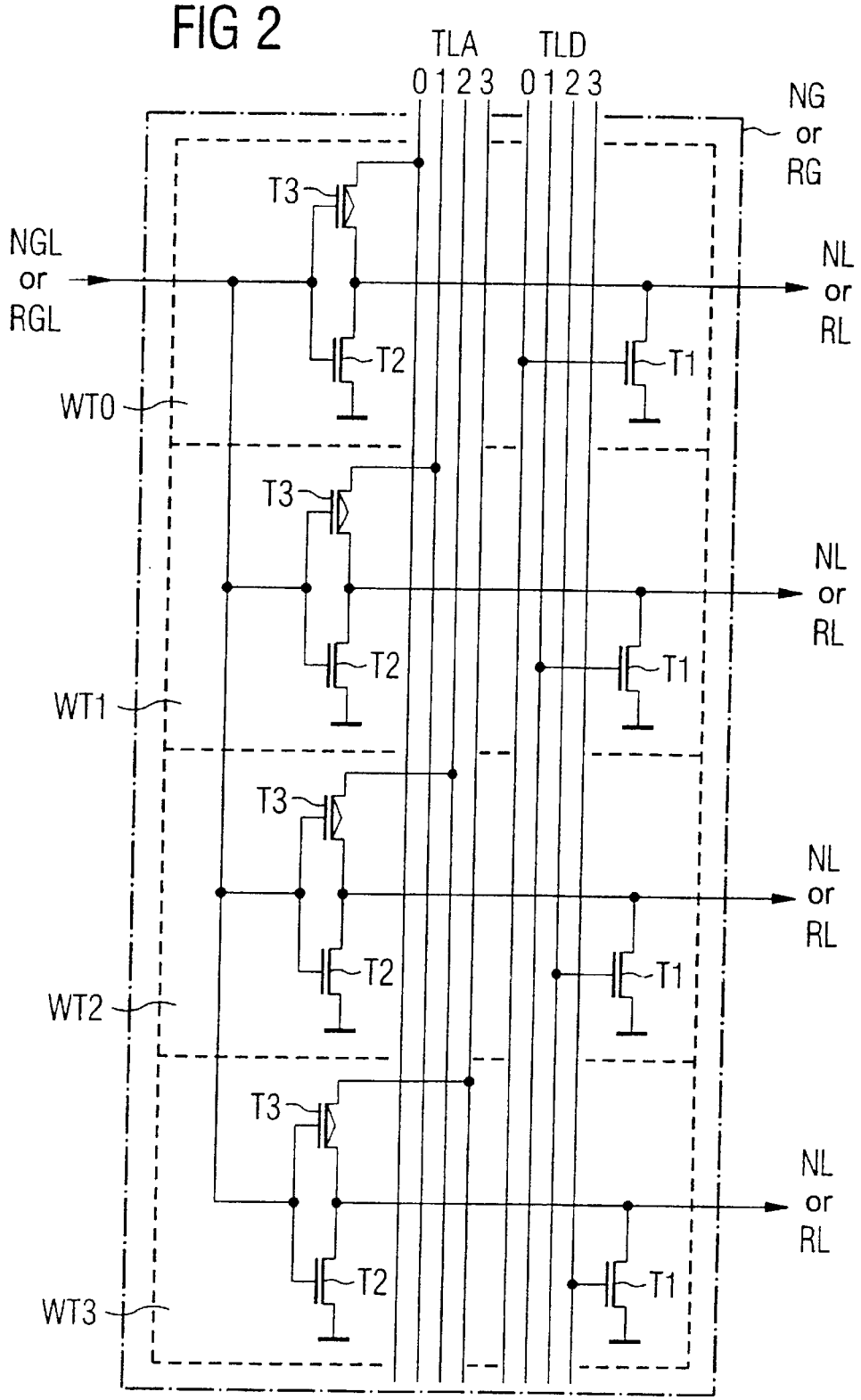
FIG. 2 is a circuit diagram of a word line driver group for driving a group of p=4 word lines.

FIG. 2 illustrates the circuit diagram of a driver group, including four word line drivers WT0, WT1, WT2 and WT3, each of which contains two N-channel field-effect transistors (N-FETs) T1 and T2 and a P-channel field-effect transistor (P-FET) T3. On the output side, each driver is connected to an associated word line of the assigned word line group. In detail, in each driver, the assigned word line is contact-connected to the drains of the three transistors T1, T2, T3 in the assigned driver. The sources of T1 and T2 are contact-connected to ground (L potential). The gates of T2 and T3 of all the drivers of the group NG127 are connected to the common group selection line NGL127.

In accordance with FIG. 2, two parallel line bundles TLA and TLD pass through all the driver groups, each of which line bundles contains p=4 driver selection lines TLA{0:4} and TLD{0:4}, respectively. In each driver group, TLA0 and TLD0 are assigned to the driver WT0, TLA1 and TLD1 are assigned to the driver WT1, TLA2 and TLD2 are assigned to the driver WT2, and TLA3 and TLD3 are assigned to the driver WT3. In each driver WT{0:3} the source of T1 is contact-connected to the assigned TLA, and the drain of T3 is contact-connected to the assigned TLD. For the selection of a driver group, the assigned group selection line NGL or RGL, respectively, is put at L level by the group decoder (not shown), so that, in all the drivers belonging to the group, the transistor T3 turns on and the transistor T2 turns off.

In order to activate a word line NL or RL of the selected group, only that TLD line which is assigned to the relevant driver within the group is switched to L level, so that T1 turns off and the word line is decoupled from the L ground potential. Furthermore, only that TLA line which is assigned to the relevant driver within the group is switched to H level, so that H level is coupled via the turned-on T3 to the word line. The remaining TLD lines are held at L level, and the remaining TLA lines are held at H level, so that the other word lines remain at ground potential.

For the subsequent deactivation of the activated word line NL or RL, the TLA line that was previously put at H level is brought to L level again, and at the same time (or shortly afterward) the TLD line of the selected group that was previously put at L level and the relevant group selection line are switched to H level, and the TLA line assigned to the relevant driver in the group is switched to L level.

Figure 3:
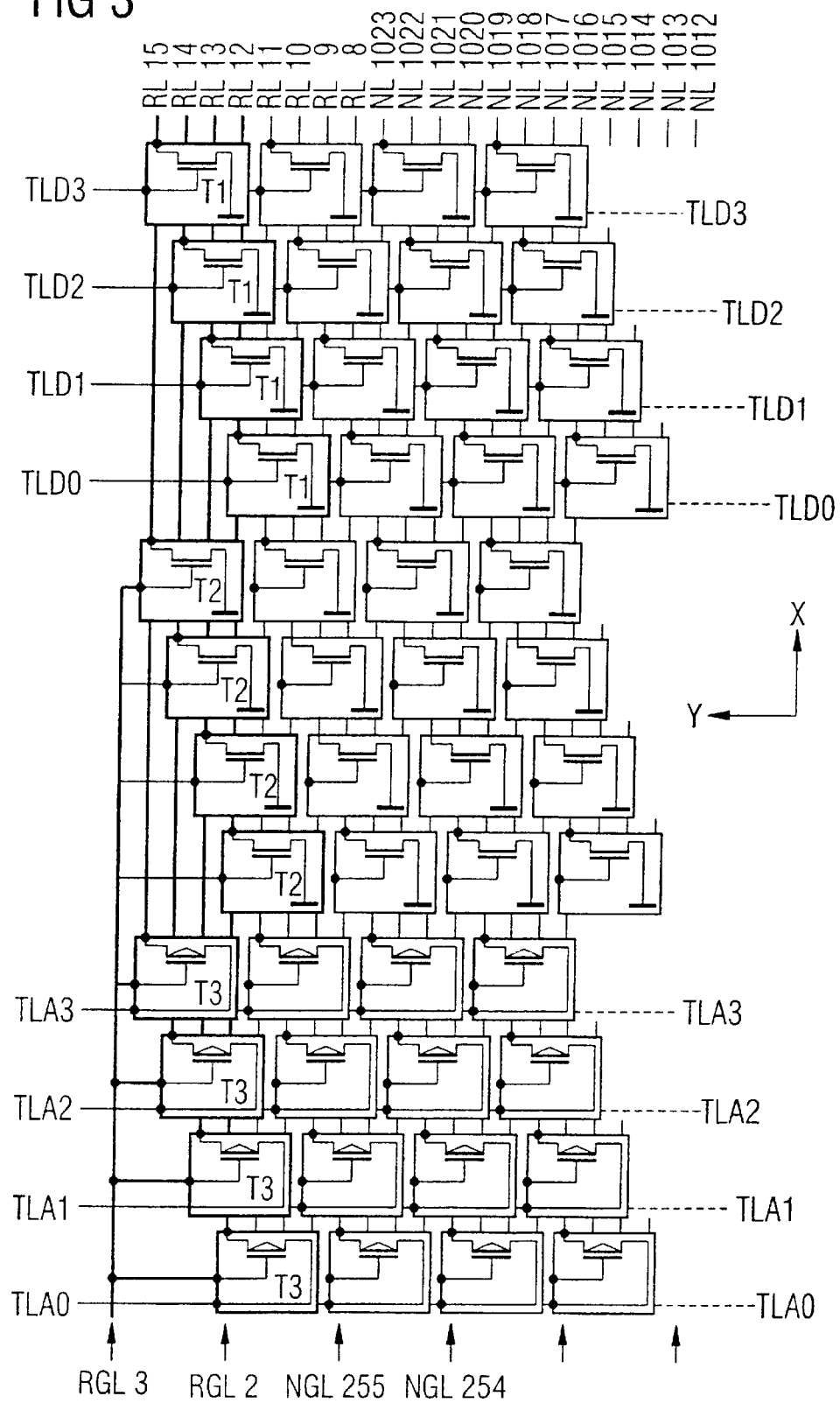
FIG. 3 is a schematic diagram for illustrating the positioning of individual transistors of a plurality of driver groups according to FIG. 2, wherein the individual transistors lie spatially one behind the other in the row direction for illustrating the routing of the assigned word lines at one end of the configuration according to FIG. 1.

FIG. 3 diagrammatically shows how the transistors T1, T2, T3 of the drivers are situated relative to one another on the memory chip. FIG. 3 shows that detail from the driver array illustrated in FIG. 1 which encompasses the drivers for the eight "last" regular word lines NL{1016:1023} and the subsequent eight "last" redundant word lines RL{8:15}. The view of FIG. 3 is rotated counterclockwise by 90° in the plane of the drawing relative to the view according to FIG. 1.

In order to more easily identify the assignment between word lines and driver groups, in FIG. 3, the four word lines RL{12:15} of the last word line group are drawn bold, and the transistors of the associated driver group (RG3 in accordance with FIG. 1) are drawn with a bold border. The group selection line RGL3, which is assigned precisely to the driver group RG3, is likewise drawn bold. In order furthermore to illustrate the association of the transistors with the various drivers within the group, the transistors T1, T2, T3 of the driver assigned to the last word line RL15 are emphasized by finely dotted shading, the transistors T1, T2, T3 of the driver assigned to the penultimate word line RL14 are emphasized by medium-finely dotted shading, the transistors T1, T2, T3 of the driver assigned to the third from last word line RL13 are emphasized by coarsely dotted shading, and the transistors T1, T2, T3 of the driver assigned to the fourth from last word line RL15 are drawn without shading.

It is evident in FIG. 3 that the transistor T1—driven at its gate by TLD3—for the word line RL15 lies nearest to the cell array (at the top in FIG. 3). There then follow, with increasing distance from the cell array and offset in each case by the word line pitch in the column direction, the T1 for RL14, which is driven by TLD2, the T1 for RL13, which is driven by TLD1, and the T1 for RL12, which is driven by TLD0. In subsequent sections, increasingly further away from the cell array and in in each case the same pattern as the transistors T1, there follow the four transistors T2 and then the four transistors T3, in each case for the same word line group RL{15:12}.

The uniformly spaced apart word lines run parallel into the driver groups, where they are contact-connected to the transistors of the drivers. The driver selection lines TLD{0:3} and TLA{0:3} run at right angles to the word lines and likewise parallel to one another through all the driver groups, where they are likewise contact-connected to the transistors of the drivers, the former to the gates of the transistors T1 and the latter to the sources of the transistors T3. Each group selection line RGL or NGL is contact-connected to the gates of the transistors T2 and T3 in the assigned driver groups.

It can be seen in FIG. 3 that the location of each driver can be defined by specifying its position in a regular two-dimensional pattern of possible positions. The first dimension of the pattern is the "row direction", i.e. the spatial direction "X" of the rows or word lines in the cell array (vertical in FIG. 3). The second dimension is the "column direction", i.e. the spatial direction "Y" of the columns or of the column-parallel edge of the cell array, which usually runs perpendicularly to the row direction (horizontal in FIG. 3). The spatial position of a driver can thus be defined by its X spatial coordinate and its Y spatial coordinate.

The regular pattern of the permissible locations or positions which can be occupied by a driver is configured as follows: the Y coordinates of the permissible pattern locations have a uniform distance from one another; in accordance with the number p of driver selection lines TLD or TLA (p=4 in the example considered here), there are only p different X coordinates for the pattern locations; locations having the same X coordinate succeed one another in the Y direction in each case at a distance which is equal to p times the distance of the Y coordinates. Each of the "locations" of the pattern is a set of points which form an area—including a plurality of subareas—in the XY plane which can be regarded as elementary region of a two-dimensional lattice. The coordinates of a location are the coordinates of any reference point of the relevant location, the reference points of the locations always having the same position within the respective locations.

In accordance with the pattern described, according to FIG. 3, by way of example, the driver for the word line RL15 (finely dotted shading) occupies the "third" X coordinate and the last Y coordinate. The driver for the word line RL14 (medium-finely dotted shading) occupies the "second" X coordinate and the penultimate Y coordinate. The driver for the word line RL13 (coarsely dotted shading) occupies the "first" X coordinate and the third from last Y coordinate. The driver for the word line RL12 (unshaded) occupies the "zeroth" X coordinate and the fourth from last Y coordinate. This sequence continues cyclically: the driver for the word line RL11 in turn occupies the third X coordinate and the fifth from last Y coordinate, the driver for the word line RL10 occupies the second X coordinate and the sixth from last Y coordinate etc.

Figure 4:
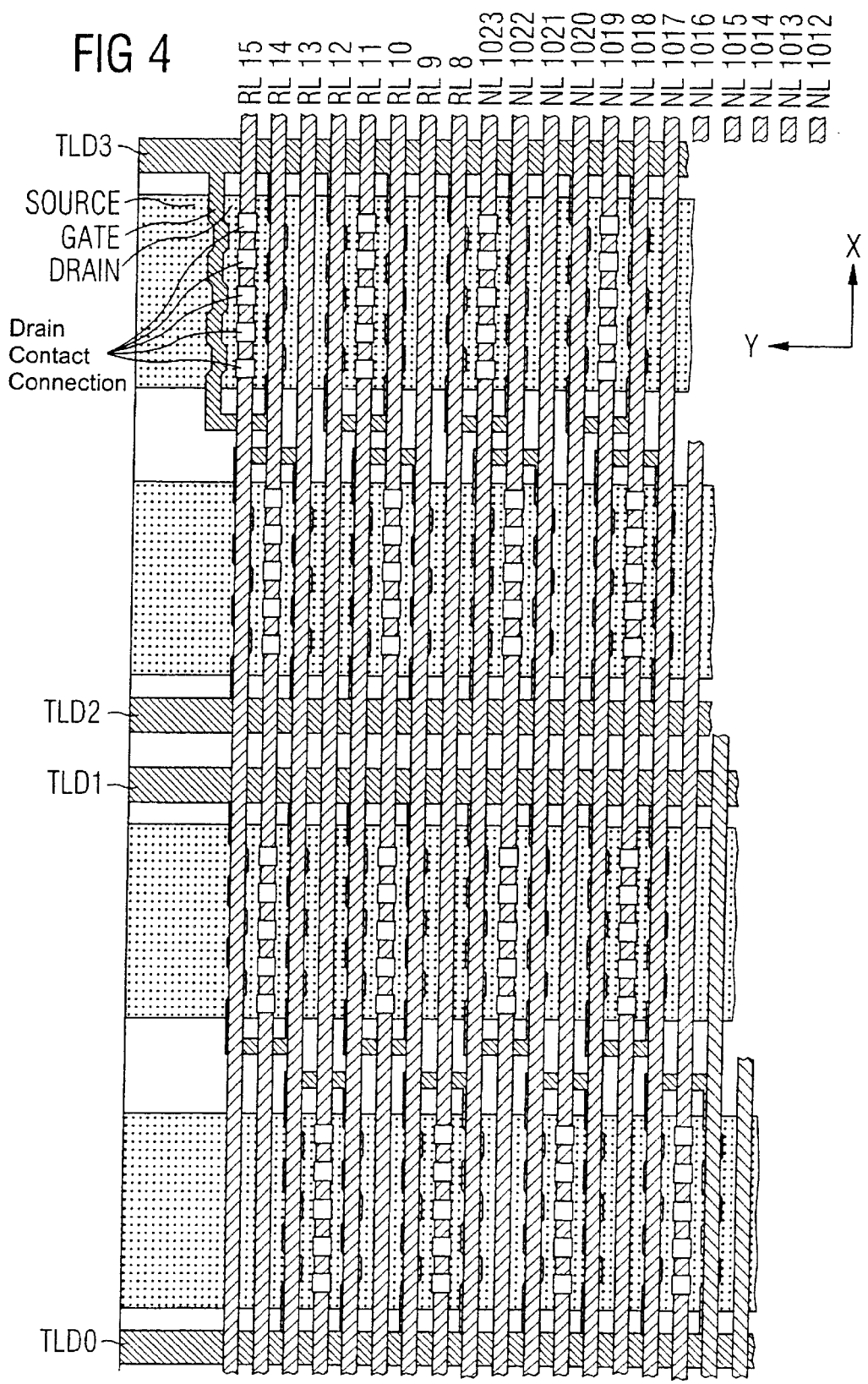
FIG. 4 is a diagrammatic partial view of an example of the exact layout of a portion of the elements illustrated diagrammatically in FIG. 3 on the surface of a memory chip.

The configuration of the drivers in a regular pattern is desirable for layout reasons, and is even absolutely necessary in most practical cases. Only with a regular pattern is it possible to accommodate the drivers in an optimally space-saving manner on a semiconductor chip and thus to keep the dimensions of the chip small. In order to illustrate this, FIG. 4 shows in elevation an exact layout for the diagram illustrated in FIG. 3, i.e. the pattern and the contours of various semiconductor and metallization zones which are fabricated lithographically, through the use of the generally known mask technique, in planes lying one above the other on the surface of the chip, in order to form semiconductor zones, transistor gates, lines and contact connections. Only the driver configuration nearest to the cell array, that includes only the transistors T1, is shown.

The vertical narrow strips that are hatched in FIG. 4 lie in a first metallization plane and form the word lines. The structure that is drawn hatched lies in a second metallization plane; it forms the driver selection lines TLD{0:3} as wide horizontal strips and, branching away therefrom, the gates of the transistors T1 as elongate vertical extensions with in each case a central cutout. Situated between the two metallization planes is a semiconductor plane in which regions of semiconductor material are defined. These regions are weakly dotted in FIG. 4 and are shown with thin boundary lines in the illustration.

Each elongate extension of the second metallization forms the gate of a respective one of the transistors (N-FETs) T1. Below its cutout, the drain zone is formed in the semiconductor material. The source zone which is common to all the transistors T1 is formed in the regions of the semiconductor material between the extensions. The channel zone of the relevant transistor lies between each drain zone and the source zone, beneath the gate metallization. The direct electrical connection between the drain zone of each transistor and the assigned word line NL or RL is produced via metal-filled contact holes. In each drain zone a plurality of such "through contacts" or "plated through holes" to the relevant word line are formed, represented by small squares in FIG. 4.

The layout structure shown for the transistors T1 in FIG. 4 continues downward in a similar manner with the transistors T2 and T3, in accordance with the diagram illustrated in FIG. 3. The group selection lines RGL and NGL and also the ground leads lie in separate metallization planes and are not shown in FIG. 4.

FIG. 1 shall now be considered again. For reasons of clarity, only the driver selection lines TLD{0:3} are illustrated in FIG. 1, which lines run through all the driver groups NG and RG, respectively, and are connected to the gates of the transistors T1 in the drivers, in accordance with the circuit diagram according to FIG. 2. The small squares drawn bold in FIG. 1 symbolize, in the individual driver groups, the locations of the "linkage points" between group selection lines NGL or RGL and driver selection lines TDL at the transistors T1, in accordance with the layout pattern shown in FIG. 4. The X and Y position coordinates of the squares are representative of the spatial coordinates of the drivers. Consequently, the small squares also illustrate the regular cyclic pattern of driver positions.

In the case illustrated, the regular pattern in the first section (below the twist region) is mirror-inverted with respect to the pattern in the second section (above the twist region). There is no break in the regularity of the driver positions in the transition from each block of the regular word lines NL{0:511} or NL{512:1023} to the adjoining block of the redundant word lines RL{0:7} or {RL8:15}. This is due to the fact that not only the total number of regular word lines but also the total number of redundant word lines are an even-numbered multiple of the group strength p (in the present case 4p=16 redundant word lines) and, consequently, the two blocks RL{0:7} and RL{8:15} of the redundant word lines in each case contain an integer multiple of p word lines (in the present case 2p=8 redundant word lines).

As mentioned in the introduction, it may be desirable, however, to provide redundant word lines in a different number than precisely an even-numbered multiple of the group strength p. Problems in the layout of the word line drivers can be expected in such a case, however. These problems shall be described below with reference to FIG. 5 for the case where, given a group strength p=4, in each case 6 redundant word lines are intended to be provided on each side of the cell array.

Figure 5:
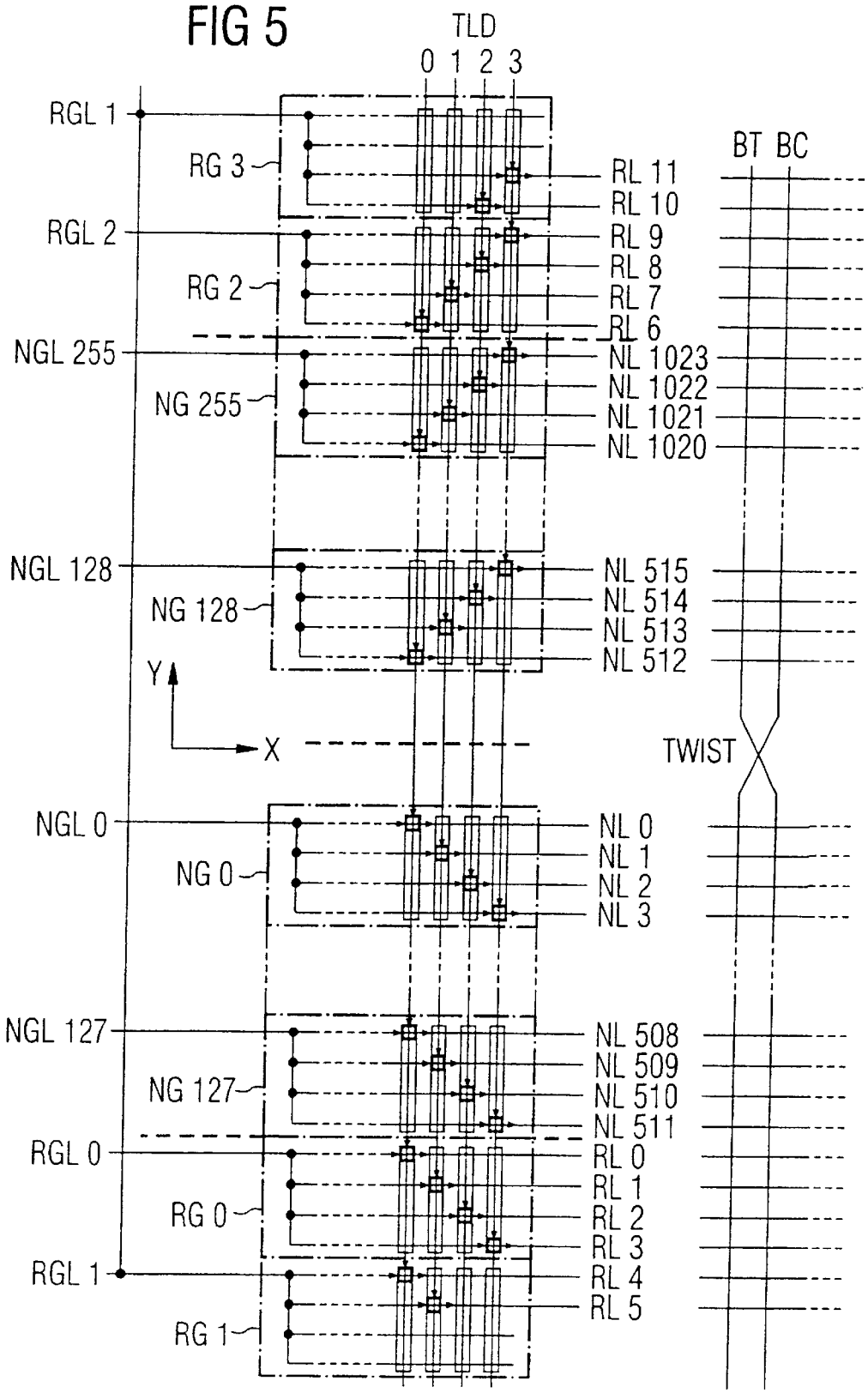
FIG. 5 is a schematic view of an example of a layout similar to FIG. 1 for illustrating the problem which arises when h is not an even number.

The configuration according to FIG. 5 differs from that according to FIG. 1 in that two word lines are in each case omitted at both outer edges of the cell array, so that the cell array is correspondingly narrower and the chip can be correspondingly smaller. In the lower half of the cell array, all the word lines are connected to drivers which occupy all the locations of the regular pattern. Accordingly, in the lower half, considered successively from top to bottom, the assignment of all the word lines NL{0:511} and then RL{0:6} to the driver selection signals TLD{0:3} advances in the regular sequence

TLD{0,1,2,3; . . . ,0,1,2,3;0,1,2,3;0,1}.

The drivers of the last word lines RL{4,5} of the lower half are both connected to the group selection line RGL1 and additionally contact-connect in each case one of the two first driver selection lines TLD0 and TLD1. They are thus selectable by the two linkages RGL1+TLD0 and RGL1+TLD1, as shown by the corresponding linkage points.

In the upper half of the cell array, successively from bottom to top, the assignment of the word lines NL{512:1023} and then RL{6:9} to the driver selection lines TLD{0:3} initially advances in the regular sequence

TLD{0,1,2,3; . . . ;0,1,2,3;0,1,2,3}.

Only the two linkages RGL1+TLD2 and RGL1+TLD3 are available for the selection of the last two word lines RL{10,11} of the upper half. As shown in FIG. 5, however, the relevant linkage points do not lie at locations which follow the regular pattern of the other linkage points. Consequently, the relevant drivers do not occupy locations of the regular pattern and are therefore practically not able to be accommodated in the layout.

The present invention offers a surprisingly simple way out of this dilemma. An example of a solution according to the invention to the problem described above is illustrated in FIG. 6.

The invention's configuration according to FIG. 6 differs from that according to FIG. 5 in that in the upper section of the driver array, too, all the word lines are connected to drivers which occupy locations of the regular pattern. This is possible by leaving two locations of the pattern "unoccupied" in the upper section, to be precise those whose X coordinates correspond to the X coordinates of the last two drivers in the lower section. In the case illustrated, the unoccupied pattern locations are those two whose Y coordinates directly succeed the Y coordinate of the driver of the last regular word line NL1023. This means that the subsequent redundant word lines RL{6:11}, that is to say all the redundant word lines of the upper block, can no longer run in the same direction as all the other word lines into the assigned drivers, but rather must be deflected obliquely outward in each case by the amount of two Y coordinate distances.

In the case of FIG. 6, in the lower half, considered successively from top to bottom, the assignment of all the word lines NL{0:511} and then RL{0:6} to the driver selection signals TLD{0:3} advances in the same regular sequence as in the configuration according to FIG. 5, that is to say in accordance with the scheme

TLD{0,1,2,3; . . . ,0,1,2,3;0,1,2,3;0,1).

The drivers of the last word lines RL{4,5} of the lower half, likewise as in the case of the configuration according to FIG. 5, are both connected to the group selection line RGL1 and additionally contact-connect in each case one of the two first driver selection lines TLD0 and TLD1. They are thus selectable by the two linkages RGL1+TLD0 and RGL1+TLD1. In the upper half of the cell array, successively from bottom to top, the assignment of the word lines NL{512:1023} and then RL{6:9} to the driver selection lines TLD{0:3}, initially advances in the regular sequence

TLD{0,1,2,3; . . . ;0,1,2,3;0,1,2,3)

exactly as in the case of FIG. 5. There then follow the two pattern locations with the assignment possibilities TDL{0, 1}, which are not utilized, however, and these are followed by the pattern locations with the assignment possibilities in accordance with the sequence

TLD{2,3,0,1,2,3}, which are assigned to the redundant word lines RL{6:11}. The drivers for RL{6:7} are contact-connected to the driver selection lines TLD{2:3} and are additionally connected to the same group selection line RGL1 as the drivers for RL{4:5}. The drivers for RL{8:11} are contact-connected to the driver selection lines TLD{0:3} and are additionally connected to the group selection line RGL2. Consequently, all the redundant word lines are uniquely selectable in accordance with the following linkage scheme:

Lower Section:
 RL0: RGL0+TLD0
 RL1: RGL0+TLD1
 RL2: RGL0+TLD2
 RL3: RGL0+TLD3
 RL4: RGL1+TLD0
 RL5: RGL1+TLD1
Upper Section:
 RL6: RGL1+TLD2
 RL7: RGL1+TLD3
 RL8: RGL2+TLD0
 RL9: RGL2+TLD1
 RL10: RGL2+TLD2
 RL11: RGL2+TLD3

This scheme has the advantage that not only does each driver occupy a permissible pattern location, but also the counting sequence of the group selection lines and, in addition, the counting sequence of the drivers within each group selection is adapted without any gaps to the counting sequence of the word lines. This simplifies the fuse technology if there is a desire to replace defective word lines only in bundles rather than individually, to be precise in bundles which in each case contain a plurality of adjacent word lines within the respective group and thus have the same group address.

FIG. 7 shows, in the same mode of illustration as FIG. 3, the diagram of the spatial assignment between word lines and driver positions for the configuration according to FIG. 6. FIG. 8 shows, in the same mode of illustration as FIG. 4, the precise layout for the diagram according to FIG. 7.

The "unoccupied" locations within the pattern do not actually have to be empty; they can likewise be filled with a respective driver which, however, is not connected to a word line of the cell array and is thus inactive. In FIGS. 7 and 8, this can be seen from the fact that the vertical lines that are contact-connected to the transistors of the inactive drivers are not continued as far as the cell array, but rather terminate beforehand. Filling unoccupied pattern locations with drivers (kept inactive) simplifies the design of the layout.

The configuration shown in FIGS. 6, 7 and 8 is only an illustrative example for the preferred case where n1=n2=n/2 and r1=r2=r/2 and where n1, n2 and r are in each case integer multiples of the integer p>1. In the example described, p is an integer power of 2 ($p=4=2^2$). These conditions are preferably to be met if a binary address space is intended to be optimally utilized.

Generally, a problem that can be solved by the invention arises whenever firstly the total number of all the word lines of a cell array is equal to an integer multiple of the group strength p, but secondly, in each of the two sections of the cell array, the total number of word lines deviates from an integer multiple of the group strength p, irrespective of whether this is caused by the number of regular word lines or the number of redundant word lines in the relevant section. Thus, if k is the number by which the total number of all the word lines in a first of the two sections is less than an integer multiple of p, according to the invention the pattern-conforming permissible driver locations of this section are to be occupied without any gaps, while p−k pattern locations remain unoccupied within the other section, to be precise those whose X coordinates are equal to the X coordinates of the last occupied p−k pattern locations of the first section, that is to say those p−k pattern locations which lie at the outer edge of the first section.

The unoccupied pattern locations can, in principle, lie anywhere in the relevant section. They need not necessarily be directly adjacent to one another, i.e. they need not belong to the same group, but rather can also be distributed between different groups. They may also lie entirely or partially in regions between regular word lines. The nearer the unoccupied pattern locations are to the outer edge, the fewer word lines have to be connected "obliquely". A combination of the unoccupied pattern locations as in the case of FIGS. 6, 7 and 8 has the advantage that the respective obliquely connected word lines also lie together and this obliquity is the same for all these word lines.

The configuration according to the invention may have the effect that the driver array, at the outer edge of the section containing the unoccupied pattern locations (upper edge in FIG. 6), extends somewhat further in the Y direction than the cell array. However, there is enough space for this on the chip area since a distance for accommodating the sense amplifiers connected to the bit lines must be complied with anyway between the cell array and the row-parallel outer edge of the chip.

We claim:

1. A RAM circuit, comprising:
a memory cell array including memory cells, rows and columns;
said rows and columns defining a row direction and a column direction and forming a matrix configuration, a total number of said rows being an integer multiple of an integer number p>1, said rows including an integer number n of regular rows and an integer number r of redundant rows;
regular word lines and redundant word lines;
each of said rows being assigned a respective one of said regular and redundant word lines for activating and deactivating said memory cells in a relevant one of said rows;
said memory cell array having column-parallel side edges;
a driver array disposed parallel to one of said column-parallel side edges of said memory cell array, said driver array including a plurality of drivers, a respective one of said drivers being contact-connected to a respective one of said regular and redundant word lines for driving said respective one of said regular and redundant word lines;
said memory cell array and said driver array occupying a given space subdivided into a first section and a second section;
an integer number n1>0 of said regular rows and an integer number r1>0 of said redundant rows being disposed in said first section, and n1+r1 of said drivers being disposed in said first section;
an integer number n2>0 of said regular rows and an integer number r2>0 of said redundant rows being disposed in said second section, where n1+r1 is by an integer number k less than an integer multiple of the integer number p, and n2+r2 of said drivers being disposed in said second section;
said n1+r1 of said drivers disposed in said first section each occupying a respective location allocated thereto in a regular two-dimensional first pattern of locations, said locations in said first pattern having Y coordinates measured in the column direction, the Y coordinates of said locations in said first pattern being uniformly spaced apart, each of said locations in said first pattern having one of p possible X coordinates in the row direction, adjacent ones of said locations in said first pattern with a same one of the X coordinates being spaced apart by a distance in the column direction equal to p times a spacing distance of the Y coordinates of said locations in said first pattern;
said n2+r2 of said drivers disposed in said second section each occupying a respective location allocated thereto in a regular two-dimensional second pattern of locations, said locations in said second pattern having Y coordinates measured in the column direction, the Y coordinates of said locations in said second pattern being uniformly spaced apart, each of said locations in said second pattern having one of said p possible X coordinates in the row direction, adjacent ones of said locations in said second pattern with a same one of the X coordinates being spaced apart by a distance in the column direction equal to p times a spacing distance of the Y coordinates of said locations in said second pattern;
said first section having an outer edge with p−k last ones of said locations in said first pattern disposed in said outer edge; and
said locations in said first pattern being occupied without any vacancies within said first section and, within said second section, p−k of said locations in said second pattern being unoccupied locations with X coordinates identical to the x coordinates of said p−k last ones of said locations in said first pattern.

2. The RAM circuit according to claim 1, wherein:
said memory cell array includes a bit line twist region; and said first and second sections each lie on a respective different side of said bit line twist region.

3. The RAM circuit according to claim 1, wherein said first and second sections each have a respective outer edge such that at least a subset of said redundant rows are disposed in said outer edge.

4. The RAM circuit according to claim 1, wherein, in each of said first and second sections, said redundant rows form a contiguous block.

5. The RAM circuit according to claim 1, wherein:

in each of said first and second sections, all of said redundant rows situated in a respective one of said first and second sections form a contiguous block at an outer edge of said respective one of said first and second sections; and within said second section, said p−k unoccupied locations in said second pattern lie between locations occupied by said drivers for said regular rows and locations occupied by said drivers for said redundant rows.

6. The RAM circuit according to claim 1, wherein:

said integer number n1 is equal to said integer number n2, said integer number r1 is equal to said integer number r2; and said integer number n1, said integer number r2 and said integer number r are respective integer multiples of said integer number p.

7. The RAM according to claim 1, wherein said integer number p is an integer power of 2.

* * * * *